US010892450B2

(12) United States Patent
Gifford et al.

(10) Patent No.: US 10,892,450 B2
(45) Date of Patent: Jan. 12, 2021

(54) EFFECTS CONTROL MODULE AND METHOD OF MAGNETIC CLOSURE FOR BATTERY DOOR

(71) Applicant: Fender Musical Instruments Corporation, Scottsdale, AZ (US)

(72) Inventors: James M. Gifford, Tempe, AZ (US); Kevin Reddy, Phoenix, AZ (US)

(73) Assignee: Fender Musical Instruments Corporation, Scottsdale, AZ (US)

( * ) Notice: Subject to any disclaimer, the term of this patent is extended or adjusted under 35 U.S.C. 154(b) by 409 days.

(21) Appl. No.: 15/814,852

(22) Filed: Nov. 16, 2017

(65) Prior Publication Data
US 2019/0148685 A1    May 16, 2019

(51) Int. Cl.
*E05C 19/16* (2006.01)
*H01H 13/18* (2006.01)
*H01M 2/10* (2006.01)
*H05K 5/02* (2006.01)
*H01H 21/28* (2006.01)

(52) U.S. Cl.
CPC .......... *H01M 2/1055* (2013.01); *E05C 19/16* (2013.01); *E05C 19/166* (2013.01); *H01H 13/183* (2013.01); *H05K 5/0239* (2013.01); *H01H 21/282* (2013.01); *H05K 5/0221* (2013.01)

(58) Field of Classification Search
CPC ... H01M 2/1055; H01M 2/1027; E05C 19/16; E05C 19/166; H01H 13/183; H01H 21/282; H05K 5/0239; H05K 5/0221
See application file for complete search history.

(56) References Cited

U.S. PATENT DOCUMENTS

| 4,075,402 | A |   | 2/1978  | Okamoto |
|-----------|---|---|---------|---------|
| 4,281,727 | A |   | 8/1981  | Meeks |
| 5,337,215 | A | * | 8/1994  | Sunderland ......... H01M 2/1055 200/43.22 |
| 7,832,652 | B2 |  | 11/2010 | Barton et al. |
| 9,532,473 | B2 |  | 12/2016 | Yin et al. |
| 2011/0169291 | A1 | * | 7/2011 | Siethorst ............. E05B 47/0002 296/37.8 |

(Continued)

FOREIGN PATENT DOCUMENTS

FR          3029357 A1     6/2016

*Primary Examiner* — Kristina R Fulton
*Assistant Examiner* — Thomas L Neubauer
(74) *Attorney, Agent, or Firm* — Robert D. Atkins; Patent Law Group

(57) ABSTRACT

An effects control module for a musical instrument has a housing and a battery enclosure assembly rotatably coupled to the housing. The battery enclosure assembly includes a door with a magnetic plate attractive to a surface of the housing to enable final closure of the battery enclosure assembly with respect to the housing absent external force. No external human force is needed to enable and complete final closure of the battery enclosure assembly with respect to the housing after the critical magnetic position of the door. The battery enclosure assembly is disposed on a first side surface of the housing with a battery area and latch configured to contain a battery. A material is disposed on the door to soften the closure. A second side surface of the housing includes a paramagnetic material to provide substantially no magnetic influence from the second side surface of the housing.

18 Claims, 9 Drawing Sheets

(56) References Cited

U.S. PATENT DOCUMENTS

| | | | |
|---|---|---|---|
| 2011/0175376 A1* | 7/2011 | Whitens | B60R 7/06 |
| | | | 292/251.5 |
| 2013/0076059 A1 | 3/2013 | Zalan et al. | |
| 2014/0152026 A1* | 6/2014 | Cinco | E05B 83/28 |
| | | | 292/158 |

* cited by examiner

US 10,892,450 B2

EFFECTS CONTROL MODULE AND METHOD OF MAGNETIC CLOSURE FOR BATTERY DOOR

FIELD OF THE INVENTION

The present invention relates in general to accessories for musical instruments and, more particularly, to an effects control module and method of magnetic closure for a battery door.

BACKGROUND OF THE INVENTION

Musical instruments have always been very popular in society providing entertainment, social interaction, self-expression, and a business and source of livelihood for many people. String instruments are especially popular because of their active playability, tonal properties, and portability. String instruments are fun and yet challenging to play and have great sound qualities.

Guitars are one type of string musical instrument. In the case of electric guitars, the string vibration is sensed by electromagnetic pickups, which detect the string movement in an electric field and produce electrical signals representative of the string movement. The electric signals from the guitar are routed to one or more external effects control modules, audio amplifier, and speaker system to reproduce the sound.

The external effects control modules contain electronic circuits for modifying or enhancing the sound or acoustic qualities for the instrument. The various types of effects control modules include distortion, overdrive, fuzz, wah, delay, buffer, chorus, flanger, phaser, tremolo, looper, reverb, compressor, volume, octave, equalization, noise gate, acoustic, tuner, and boost. Each effects control module is built with a stand-alone housing designed for individual and separate placement on the floor near the performer to operate in part as a foot switch or pedal. The effects control module typically has hand control knobs, audio sockets, indicator lights or LEDs, and foot switch to set or enable functionality.

The effects control module requires a source of electric power to operate the electronic circuits, which modify or enhance the sound or acoustic qualities for the instrument. The power source can be a power converter, which plugs into an AC wall socket and provides DC power via wires and connector plug into the effects control module. The power converter requires a nearby AC power source and allows limited physical placement of the effect control module on the floor due to the length of the power converter wire. The power converter wire can create a handling or tripping obstacle and is susceptible to being disconnected during the performance.

Alternatively, a battery is disposed within a compartment of the effects control module housing to provide DC operating power to the electronic circuits. A battery has an inherent limited operating life and requires regular replacement. Most, if not all, effects control modules require at least partial disassembly of the module housing to access the battery in the compartment, typically located on the bottom of the module. The performer often has to handle the effects control module to remove screws, nuts, or other latching mechanism with hand tools. The performer then opens the access covers, replaces the battery, and reassembles the module, again with the requisite hand tools. The battery changing operation for the effects control module is time consuming, inconvenient, and requires hand tools and at least some level of know-how for the disassembly and battery replacement procedure.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
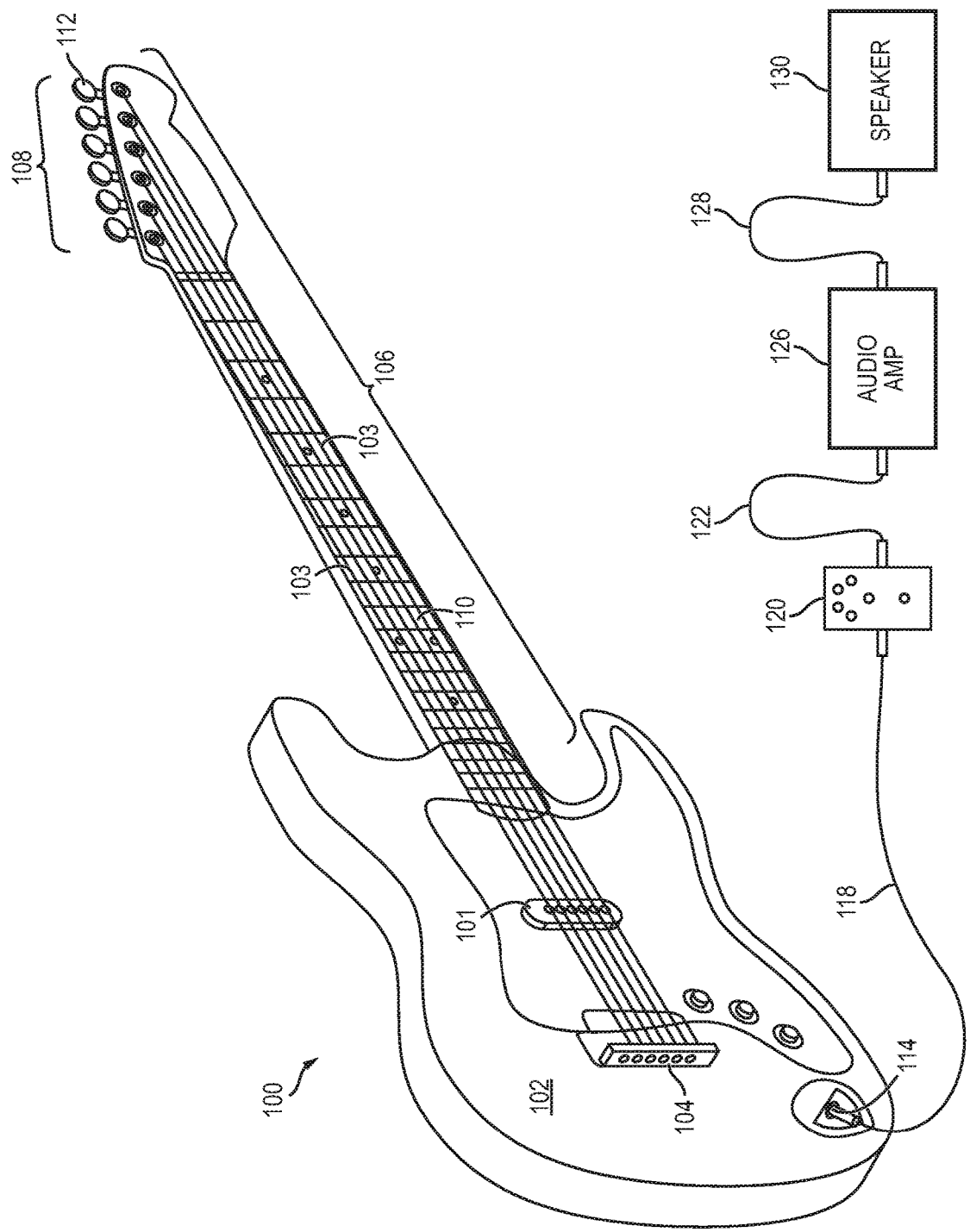
FIG. 1 illustrates a guitar connected to an effects control module, audio amplifier, and speaker.

FIG. 1 illustrates guitar 100 with one or more pickups 101 mounted to body 102 under strings 103. Guitar 100 can be an electric guitar, electric bass guitar, or any other string musical instrument. Bridge 104 anchors and supports one end of strings 103. Neck 106 of electric guitar 100 includes headstock 108 and fretboard 110. Machine heads 112 are attached to headstock 108 and anchor an opposite end of strings 103. The tension of strings 103 is adjusted and guitar 100 is tuned by turning machine heads 112. Pickups 101 convert string movement or vibration to electrical signals representative of the intended sounds from the vibrating strings. The electrical signals extend over a range or spectrum of frequencies with an amplitude associated with each frequency component.

The electrical signals from guitar 100 are routed through audio cable 118 to effects control module 120 used to modify or enhance the sound or acoustic qualities for the instrument. Audio cable 118 is inserted into audio output jack 114 of electric guitar 100 and further inserted into an audio input jack of effects control module 120. The output signal of effects control module 120 is routed through audio cable 122 to audio amplifier 126 for signal processing and power amplification. Audio cable 122 is inserted into an audio output jack of effects control module 120 and further inserted into an audio input jack of audio amplifier 126. The signal conditioning provided by audio amplifier 126 includes amplification, filtering, equalization, sound effects, user-defined modules, or other signal processing functions that adjust the power level and enhance the signal properties of the audio signal. The processed audio signal is routed from audio amplifier 126 through audio cable 128 to speaker 130. Audio cable 128 is inserted into an audio output jack of audio amplifier 126 and further inserted into an audio input jack of speaker 130. The power amplification provided by audio amplifier 126 increases or decreases the power level and signal strength of the audio signal to drive speaker 130 and reproduce the sound content intended by the vibrating strings 103 of electric guitar 100 with the enhancements introduced into the audio signal by effects control module 120 and audio amplifier 126. Speaker 130 audibly reproduces the audio signal originating from electric guitar 100 for recognition and appreciation by an audience or listener.

Figure 2A:
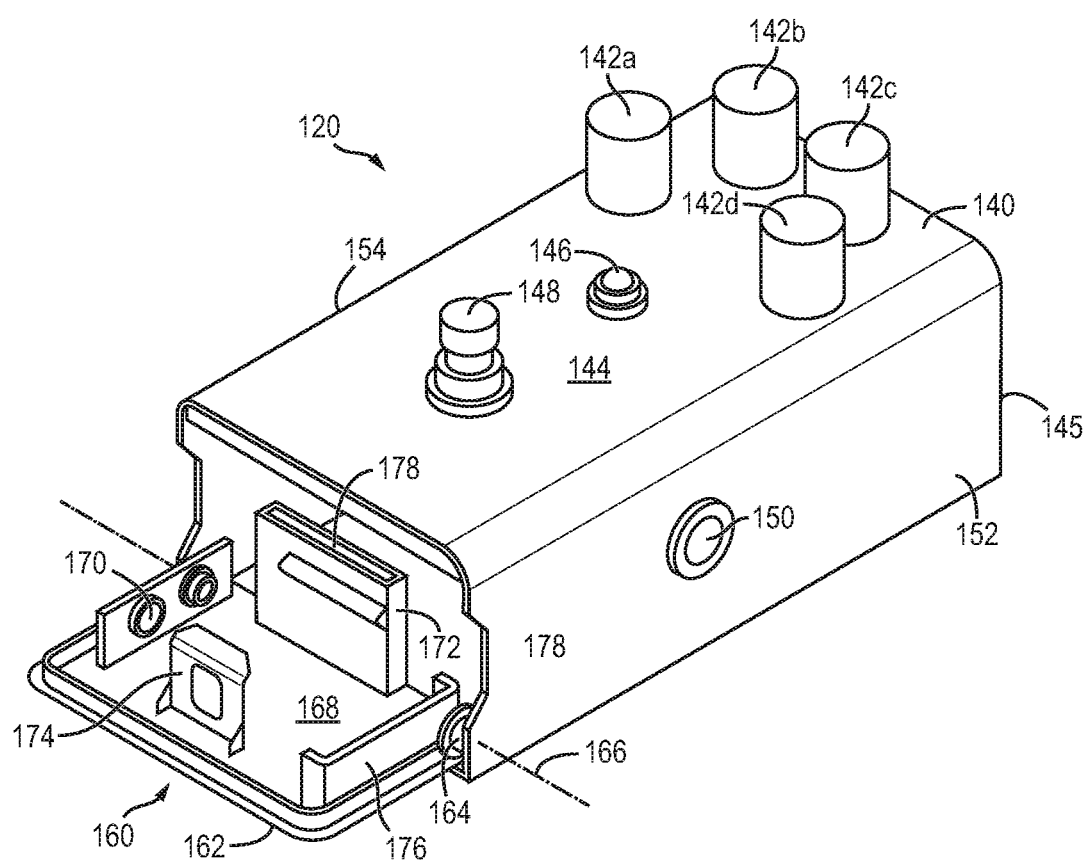
FIGS. 2a-2g illustrate an effects control module with magnetic closure.

FIG. 2a illustrates further detail of effects control module 120 with stand-alone housing 140 designed for individual and separate placement on the floor near the performer to operate in part as a foot switch or pedal. Housing 140 contains electronic circuits for modifying or enhancing the sound or acoustic qualities for the instrument. Effects control module 120 can provide features such as distortion, overdrive, fuzz, wah, delay, buffer, chorus, flanger, phaser, tremolo, looper, reverb, compressor, volume, octave, equalization, noise gate, acoustic, tuner, and boost. Hand control knobs 142 are provided on surface 144 to set the various levels and functions specific to effects control module 120, e.g., frequency, level, feedback, depth, and delay. In one embodiment of a reverb control module, hand control knob 142a sets level, hand control knob 142b sets damping, hand control knob 142c sets time, and hand control knob 142d sets tone. Light or LED 146 is located on surface 144 and indicates power on or power off state of effects control module 120. One or more switches 148 are located on surface 144 and provides physical control over power on or power off. Switch 148 is typically activated by the foot of the performer. Alternatively, switch 148 can incrementally increase or decrease various levels and functions specific to effects control module 120. Audio jack 150 is located on side surface 152 of housing 140. Audio cable 122 couples to audio jack 150 to provide the audio output signal from effects control module 120 to audio amplifier 126. Another audio jack (not shown) is located on side surface 154 opposite side surface 152 to receive the audio signal from electric guitar 100.

Battery enclosure assembly 160 includes plate or door 162 shown in the open position. Door 162 includes hinges 164 coupled to housing 140. Hinges 164 allow battery enclosure assembly 160 to rotate freely about axis 166. A battery is disposed in battery area 168 of door 162. Electrical connectors 170 for the battery are coupled to risers extending from door 162 and are wired to the electronic circuits in effects control module 120. Plate 172 extends perpendicular from door 162 and will close to bottom surface 194 of effects control module 120. Flexible latch 174 includes a lip to hold the battery in area 168. Support plate 176 extends perpendicular from door 162 and further supports the battery in area 168. Plate 172 includes rare-earth magnetic material 178, such as neodymium (Nd), neodymium iron boron (NdFeB), NiB, alloys of Nd, or other permanent magnetic material. Plate 172 with magnetic material 178 is rigidly attached, or molded as a single integrated unit with door 162, and extends perpendicular (right angle) from a surface of the door. Given the rigid attachment or single integrated unit, plate 172 with magnetic material 178 moves in unison with door 162.

Figure 2B:
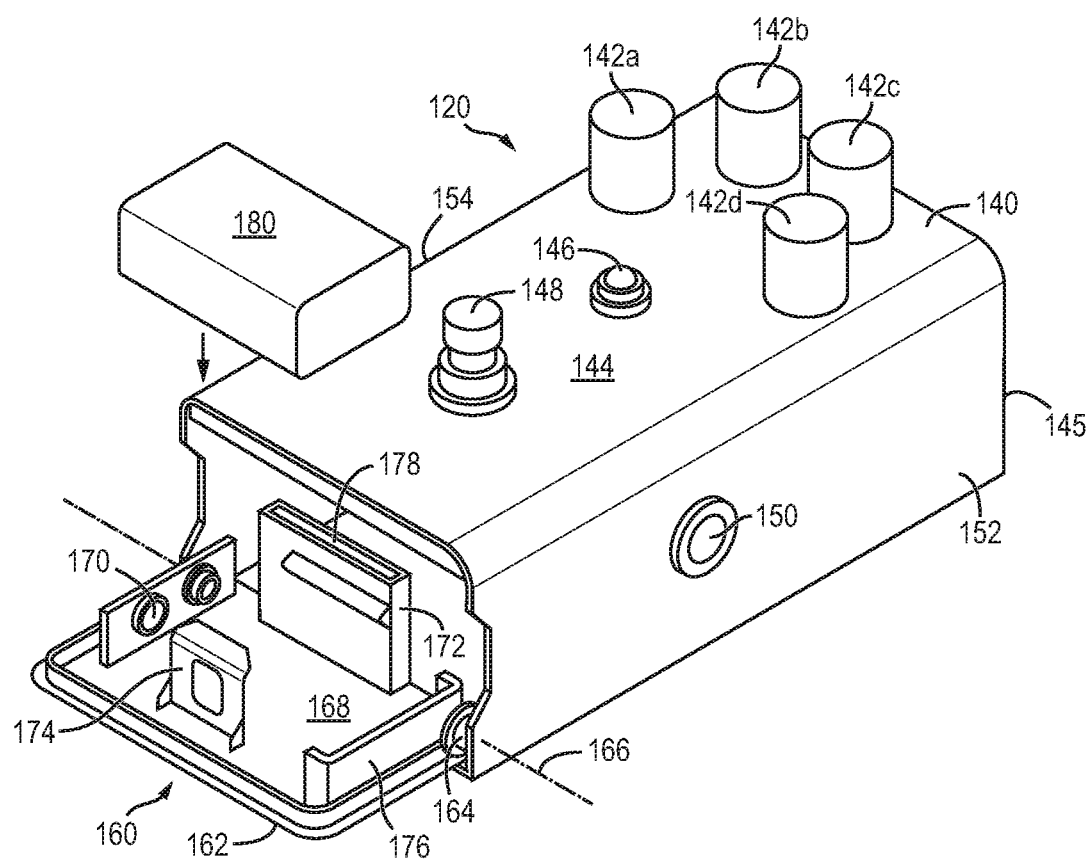
Figure 2C:
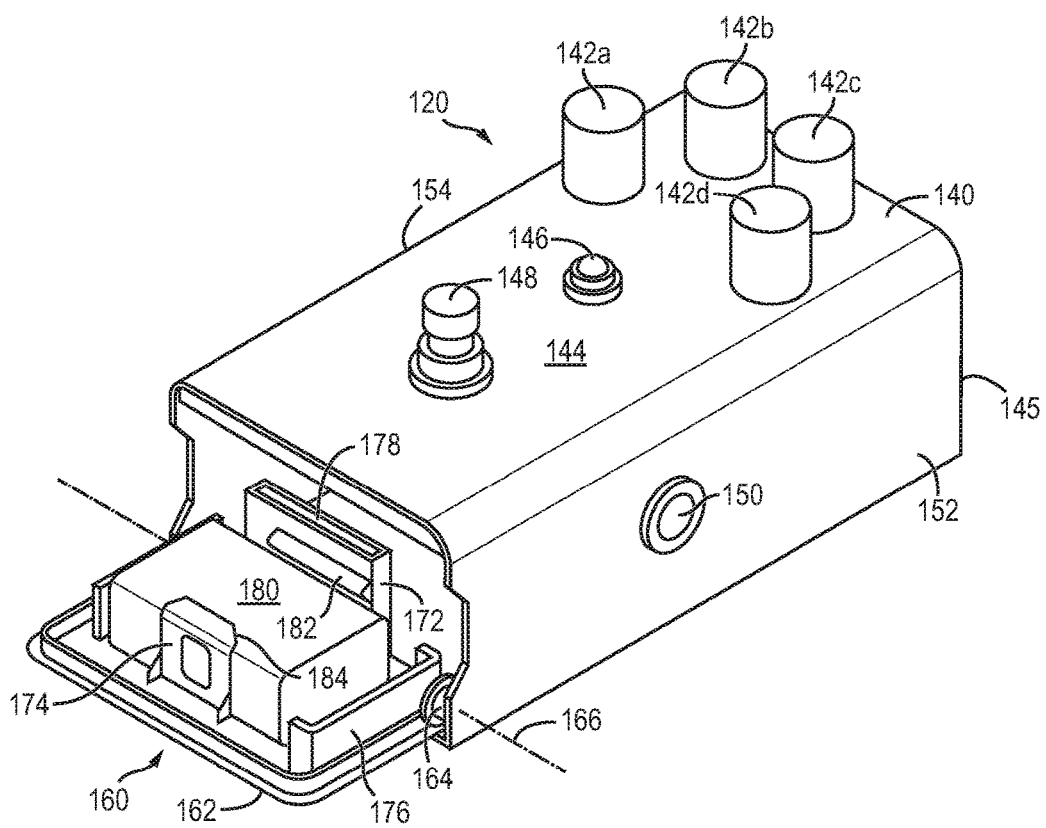

In FIG. 2b, battery 180 is positioned over battery enclosure assembly 160 and aligned with battery area 168. Flexible latch 174 bends outward during placement of battery 180 in area 168 and then returns to normal position to hold the battery firmly in place. The terminals of battery 180 make electrical contact with connectors 170 during the placement motion. The placement and connection of battery 180 in area 168 is a simple, one-hand operation. FIG. 2c shows battery 180 disposed in battery area 168 and connected to electrical connectors 170. Battery 180 provides DC operating power for the electronic circuits in effects control module 120. Battery enclosure assembly 160 is shown configured for a standard 9 volt rectangular battery. Battery enclosure assembly 160 can be configured for other types of batteries, e.g., C-cell, D-cell, AA, or AAA batteries.

Figure 2D:
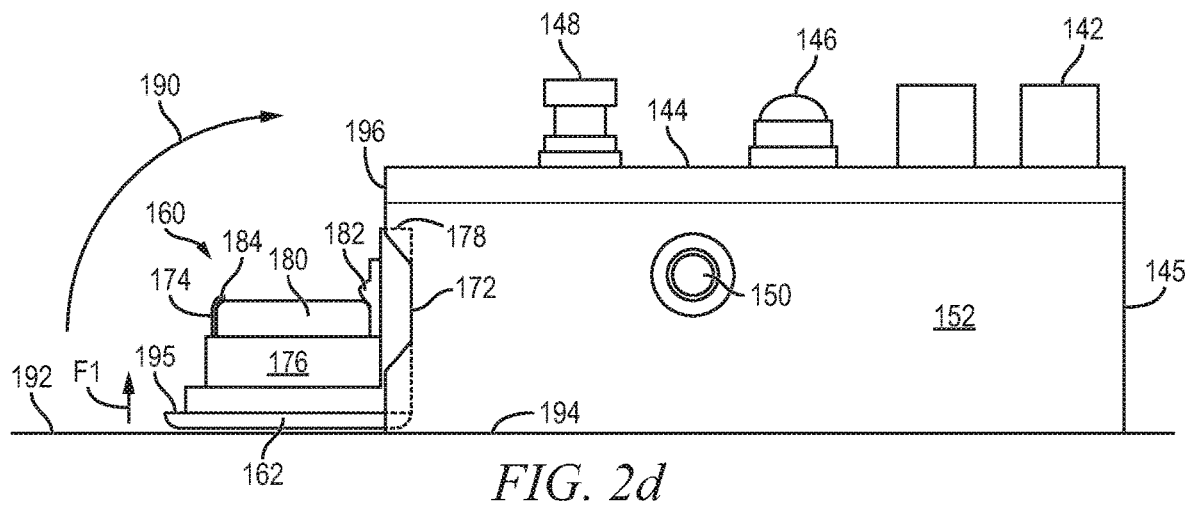
Figure 2E:
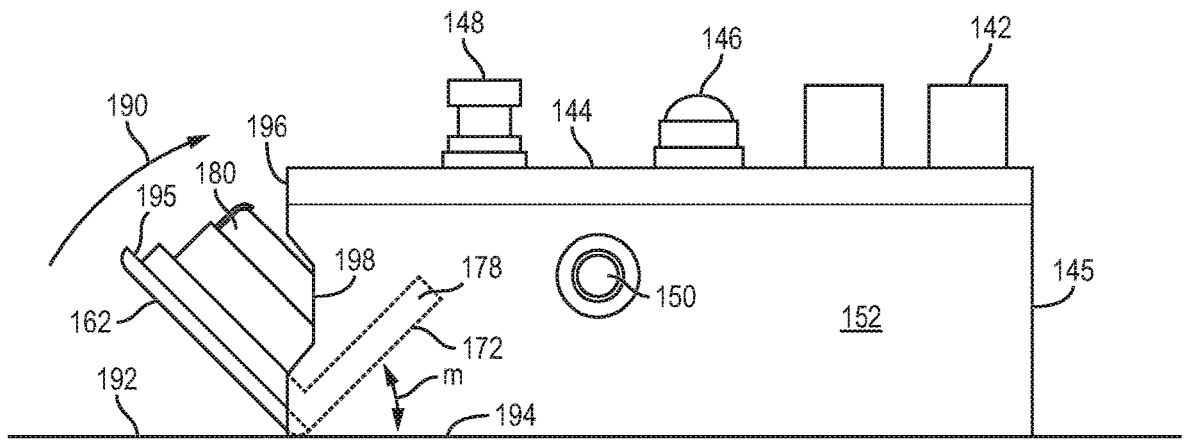
Figure 2F:
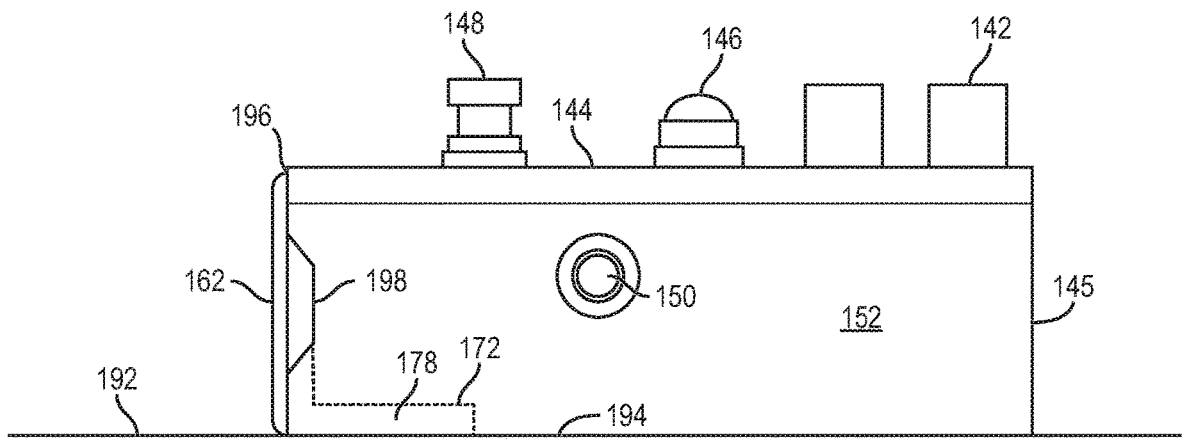

FIG. 2d shows a side view of battery 180 held in place by lip 182 on plate 172, flexible latch 174 with lip 184, and support plate 176. Once battery 180 is installed in battery area 168, battery enclosure assembly 160 is closed in the direction of arrow or arc 190 with door 162 rotating until surface 195 of the door contacts surface 196 of housing 140. The closure of battery enclosure assembly 160 and door 162 is magnetically assisted by magnetic material 178 in plate 172. In particular, the performer or user rotates door 162 by human force F1 (hand or foot) from the fully open horizontal position (0 degrees with respect to surface 192) in the direction of arc 190. Since plate 172 with magnetic material 178 is rigidly attached, or molded as a single integrated unit with door 162, the plate rotate in unison with the door (offset by 90 degrees) toward interior surface 194 of housing 140 under human force F1. The interior surface 194 is made with ferromagnetic material, such as iron, nickel, cobalt, gadolinium, dysprosium, and alloys such as steel that contain ferromagnetic metals, which are magnetically attractive to magnetic material 178. There is insufficient magnetic force M to move or close door 162 when the door is in the fully open horizontal position or rotated about axis 166 less than the critical magnetic position or angle. As door 162 reaches a critical magnetic position or angle in its travel through arc 190, e.g., about 45 degrees with respect to surface 192, as shown in FIG. 2e, the magnetic attraction M between magnetic material 178 and interior surface 194 takes over and completes the final closure of door 162, with no additional human force F1 required beyond the critical magnetic position or angle. No further external human force F1 is needed to enable and complete final closure of battery enclosure assembly 120 with respect to housing 140 after the critical magnetic position or angle of door 162 in FIG. 2e. The magnetic attraction M between magnetic material 178 and interior surface 194 pulls door 162 to complete final closure so that surface 195 contacts surface 196 of housing 140, as shown in FIG. 2f. Magnetic material 178 remain in contact with interior surface 194 by nature of the magnetic attraction M to keep surface 195 of door 162 in the vertical position, firmly seated against surface 196 of housing 140.

Figure 2G:
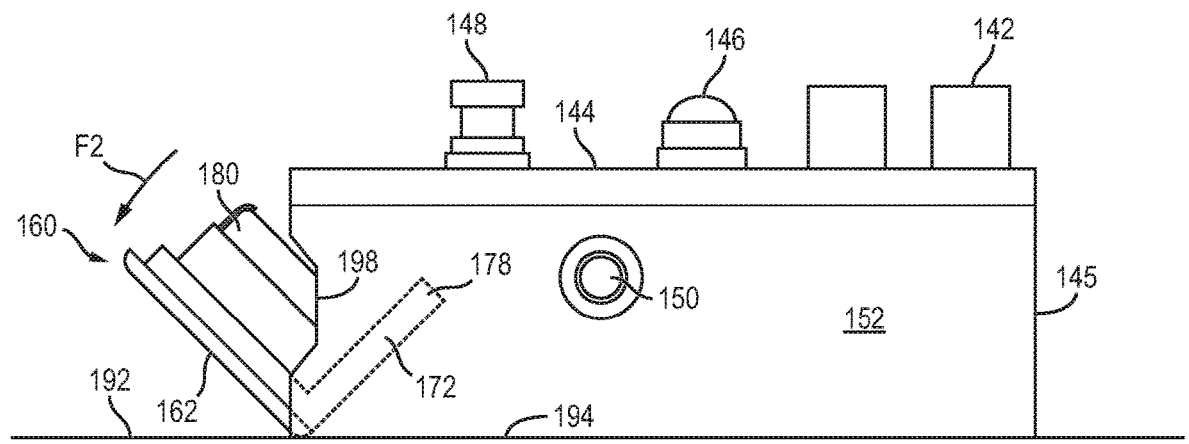

To open door 162, another human force F2 is required to separate magnetic material 178 from interior surface 194 in order to replace battery 180, see FIG. 2g. Release notch 198 in housing 140 provides a convenient access and lever arm point to apply human force F2 to battery enclosure assembly 160.

Figure 3:
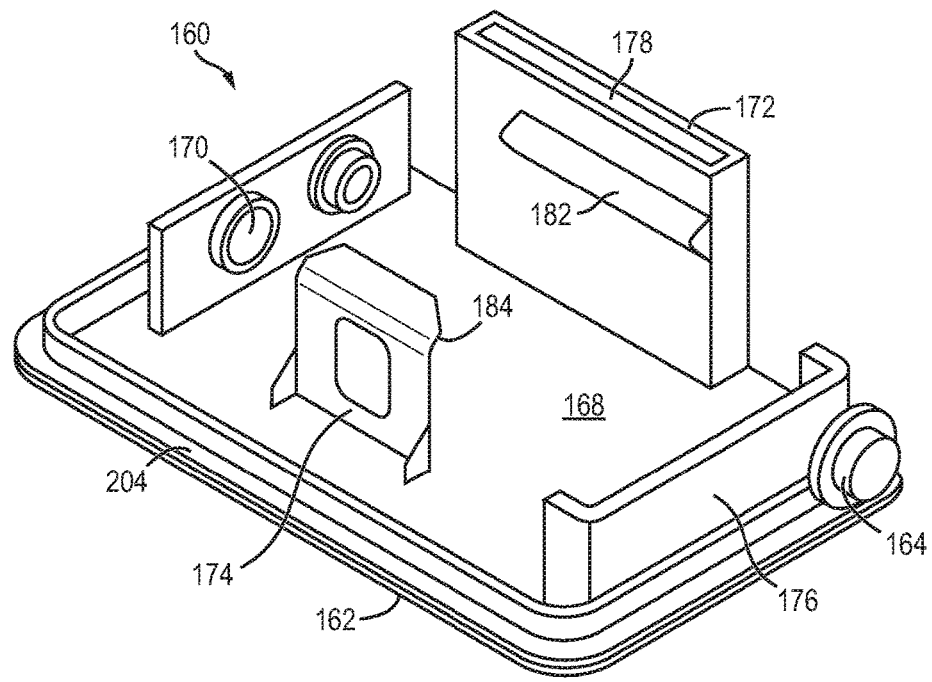
FIG. 3 illustrates further detail of the magnetic closure mechanism.

FIG. 3 shows further detail of battery enclosure assembly 160, including plate or door 162 and hinges 164. Battery 180 is disposed in battery area 168 of door 162. Electrical connectors 170 for battery 180 are coupled to risers extending from door 162. Plate 172 extends perpendicular from door 162 for dust and other containment abatement when the door is closed. Plate 172 with lip 182 and flexible latch 174 with lip 184 hold battery 180 in area 168. Support plate 176 extends perpendicular from door 162 and further supports battery 180 in area 168. Plate 172 with magnetic material 178 is rigidly attached, or molded as a single integrated unit with door 162, to rotate in unison with the door (offset by 90 degrees) toward interior surface 194 of housing 140 under human force F1. Magnetic material 178 includes rare-earth magnetic material, such as Nd, NdFeB, NiB, alloys of Nd, or other permanent magnetic material, to provide magnetic attraction to interior surface 194 of housing 140, which completes final closure of battery enclosure assembly 160 past the critical magnetic position or angle.

Figure 4A:
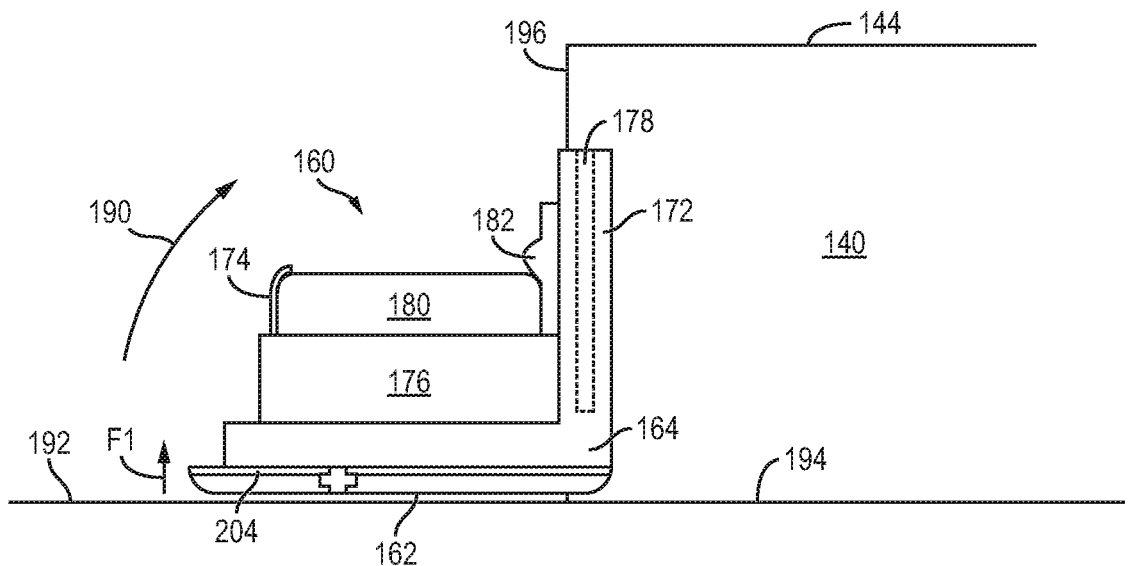
FIGS. 4a-4d illustrate further detail of the closure of the magnetic closure mechanism.

FIGS. 4a-4d show further detail of the closure operation of battery enclosure assembly 160. FIG. 4a shows battery enclosure assembly 160 again in the fully open position, i.e., 0 degrees with respect to surface 192. As an additional feature, gasket material 204 is formed around a perimeter of door 162 to soften the contact between the door and housing 140. Gasket material 204 can be rubber, plastic, polymer, fabric, felt, or other soft material.

Figure 4B:
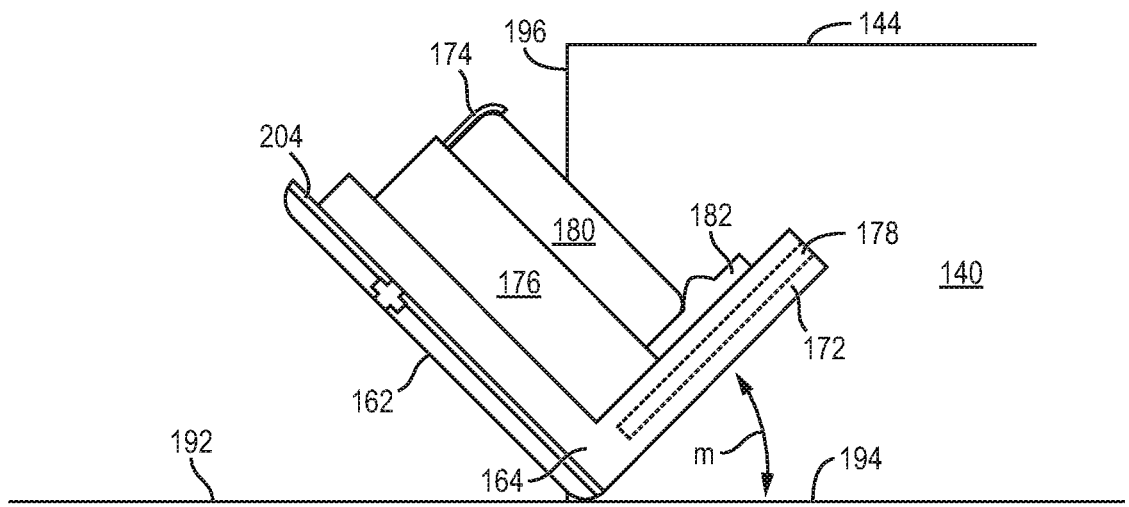
Figure 4C:
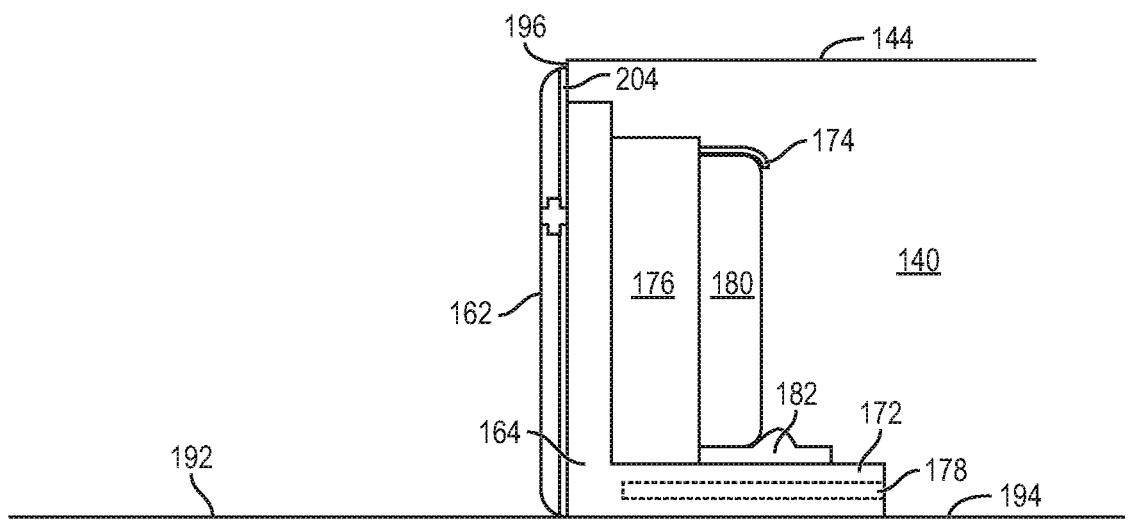
Figure 4D:
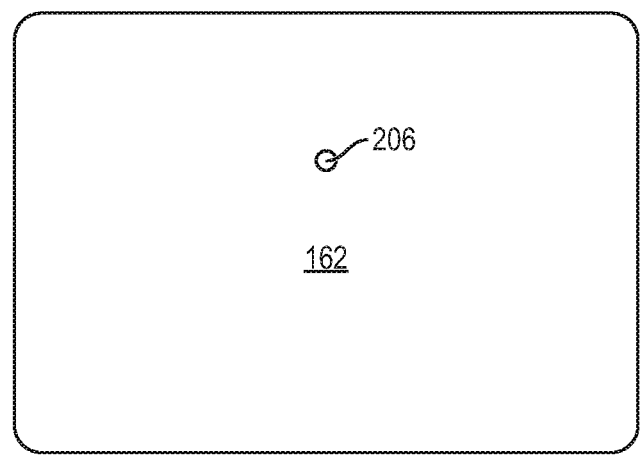

In FIG. 4b, the performer or user rotates door 162 by human force F1 in the direction of arc 190. Magnetic material 178 rotate in unison with door 162 toward interior surface 194 of housing 140 under human force F1. FIGS. 4a-4c show an interior region of housing 140. At the critical magnetic position or angle shown in FIG. 4b, rare-earth magnetic material 178 in plate 172 is magnetically attracted to interior surface 194. There is insufficient magnetic force M to move or close door 162 when the door is in the fully open horizontal position or rotated about axis 166 less than the critical magnetic position or angle. The magnetic attraction M between magnetic material 178 and interior surface 194 takes over and completes the final closure of door 162 with no additional human force F1 beyond the critical magnetic position or angle. No external human force is needed to enable and complete final closure of battery enclosure assembly 160 with respect to housing 140 after the critical magnetic position or angle of door 162. Gasket material 204 around door 162 provides a quality final closure without a snap contact of metal striking metal. The magnetic attraction M between magnetic material 178 and interior surface 194 pulls door 162 to complete final closure so that gasket material 204 contacts surface 196 of housing 140, as shown in FIG. 4c. FIG. 4d shows a front view of door 162 with light or LED 206 to indicate battery status, e.g., low battery indicator.

Figure 5:
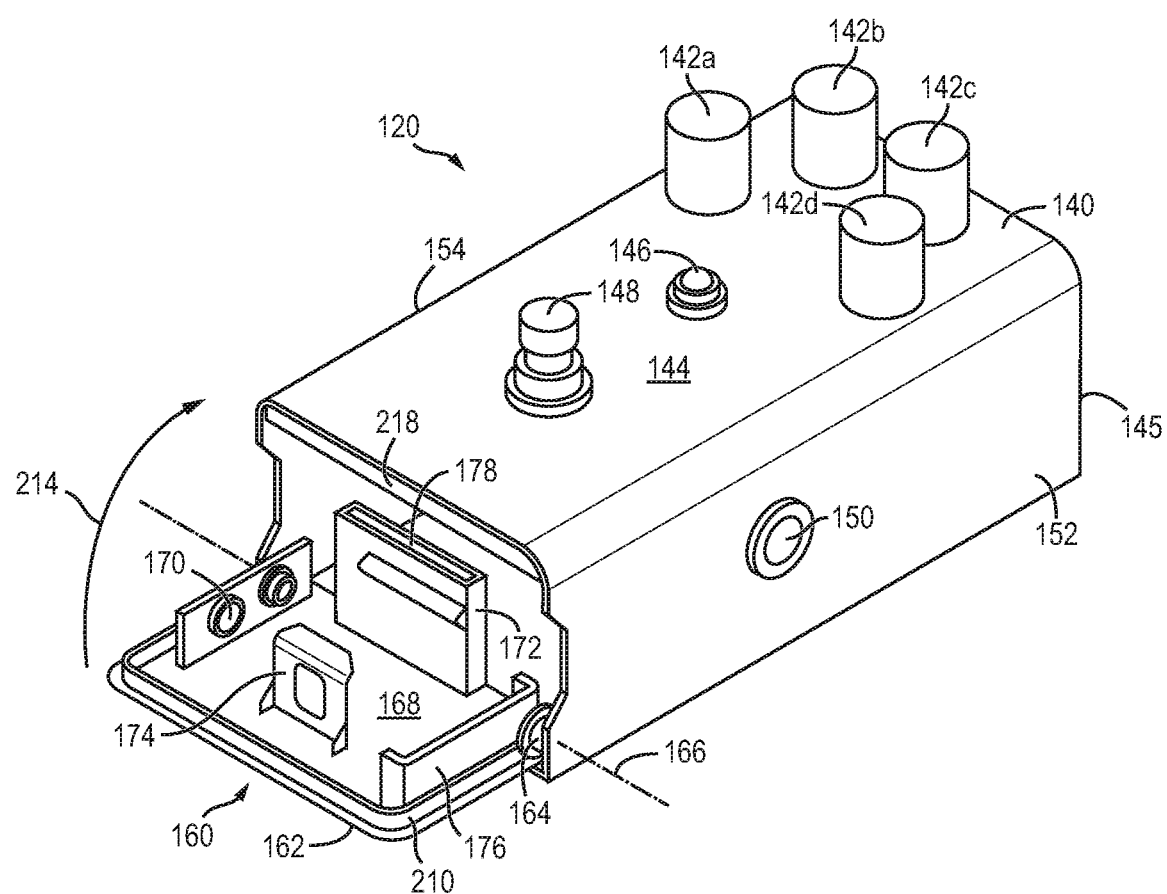
FIG. 5 illustrates an alternate embodiment of the magnetic closure mechanism.

FIG. 5 illustrates another embodiment with rare-earth magnetic material 210 such as Nd, NdFeB, NiB, alloys of Nd, or other permanent magnetic material, disposed around a perimeter of door 162. Again, the performer or user rotates door 162 by human force F1 in the direction of arrow 214, similar to FIG. 2d. At the critical magnetic position or angle, magnetic material 210 is magnetically attracted to surface 218 of housing 140. The magnetic attraction between magnetic material 210 and surface 218 takes over and completes the final closure of door 162, with no additional human force beyond the critical magnetic position or angle. No external human force is needed to enable and complete final closure of battery enclosure assembly 160 with respect to housing 140 after the critical magnetic position or angle of door 162. The magnetic attraction between magnetic material 210 and surface 218 pulls door 162 to complete and final closure.

In other embodiments, battery enclosure assembly 160 can be located on other surfaces of housing 140, e.g., surface 144, surface 145, surface 152, or surface 154 in FIG. 2a.

While one or more embodiments of the present invention have been illustrated in detail, the skilled artisan will appreciate that modifications and adaptations to those embodiments may be made without departing from the scope of the present invention as set forth in the following claims.

What is claimed:

1. An effects control module for a musical instrument, comprising:
   a stand-alone housing of the effects control module, the stand-along housing including a top surface and a bottom surface opposite the top surface; and
   a battery enclosure assembly rotatably coupled to the stand-alone housing, wherein the battery enclosure assembly includes a door with a magnetic plate extending from the door in a direction perpendicular to the door and attractive to the bottom surface of the stand-alone housing to enable final closure of the battery enclosure assembly with respect to the stand-alone housing absent external force.

2. The effects control module of claim 1, wherein the battery enclosure assembly is disposed on a first side surface of the stand-alone housing.

3. The effects control module of claim 1, wherein the final closure of the battery enclosure assembly with respect to the stand-alone housing absent external force occurs when the door reaches a critical magnetic position.

4. The effects control module of claim 1, wherein the battery enclosure assembly includes a latch configured to secure a battery.

5. The effects control module of claim 1, further including a material disposed on the door to soften the final closure.

6. The effects control module of claim 1, wherein the battery enclosure assembly includes a battery area configured to contain a battery.

7. An effects control module for a musical instrument, comprising:
   a housing of the effect control module; and
   a battery enclosure assembly rotatably coupled to the housing, wherein the battery enclosure assembly includes a door and a magnetic material extending perpendicular from the door and attractive to a surface of the housing to enable final closure of the battery enclosure assembly with respect to the housing absent external force.

8. The effects control module of claim 7, wherein the magnetic material includes a magnetic plate attractive to the surface of the housing.

9. The effects control module of claim 7, wherein the battery enclosure assembly is disposed on a first side surface of the housing.

10. The effects control module of claim 7, wherein the final closure of the battery enclosure assembly with respect to the housing absent external force occurs when the battery enclosure assembly reaches a critical magnetic position.

11. The effects control module of claim 7, further including a material disposed on the door to soften the final closure.

12. The effects control module of claim 7, wherein the battery enclosure assembly includes a battery area configured to contain a battery.

13. A method of making an effects control module for a musical instrument, comprising:
   providing a housing for the effects control module; and
   disposing a battery enclosure assembly rotatably coupled to the housing, wherein the battery enclosure assembly includes a door and a magnetic material extending perpendicular from the door and attractive to a surface of the housing to enable final closure of the battery enclosure assembly with respect to the housing absent external force.

14. The method of claim 13, wherein the magnetic material includes a magnetic plate attractive to the surface of the housing.

15. The method of claim 13, further including disposing the battery enclosure on a first side surface of the housing.

16. The method of claim 13, wherein the final closure of the battery enclosure assembly with respect to the housing absent external force occurs when the battery enclosure assembly reaches a critical magnetic position.

17. The method of claim 13, further including disposing a material on the door to soften the final closure.

18. The method of claim 13, wherein the battery enclosure assembly includes a battery area configured to contain a battery.

* * * * *